United States Patent
Kim

(10) Patent No.: US 9,257,602 B2
(45) Date of Patent: Feb. 9, 2016

(54) SUBSTRATE HAVING HETERO-STRUCTURE, METHOD FOR MANUFACTURING THE SAME AND NITRIDE SEMICONDUCTOR LIGHT EMITTING DEVICE USING THE SAME

(71) Applicant: LG ELECTRONICS INC., Seoul (KR)

(72) Inventor: Chisun Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/098,878

(22) Filed: Dec. 6, 2013

(65) Prior Publication Data

US 2014/0332833 A1 Nov. 13, 2014

(30) Foreign Application Priority Data

May 8, 2013 (KR) .................. 10-2013-0051781

(51) Int. Cl.
*H01L 33/00* (2010.01)
*H01L 33/12* (2010.01)
*H01L 21/02* (2006.01)
*H01L 29/06* (2006.01)
(Continued)

(52) U.S. Cl.
CPC ............ *H01L 33/12* (2013.01); *H01L 21/0242* (2013.01); *H01L 21/0254* (2013.01); *H01L 21/02381* (2013.01); *H01L 21/02458* (2013.01); *H01L 21/02491* (2013.01); *H01L 21/02505* (2013.01); *H01L 21/02513* (2013.01); *H01L 21/02614* (2013.01); *H01L 21/02642* (2013.01); *H01L 21/02658* (2013.01); *H01L 29/0688* (2013.01); *H01L 29/205* (2013.01); *H01L 33/025* (2013.01); *H01L 33/0075* (2013.01); *H01L 33/0079* (2013.01)

(58) Field of Classification Search
CPC ... H01L 33/12; H01L 33/025; H01L 21/0254; H01L 21/02513; H01L 21/02614; H01L 21/02642; H01L 21/02505; H01L 21/0242; H01L 21/02458; H01L 21/02381; H01L 29/205
USPC ............................................. 257/97
See application file for complete search history.

(56) References Cited

U.S. PATENT DOCUMENTS

2004/0067648 A1* 4/2004 Morita et al. ............... 438/689
2006/0205197 A1 9/2006 Yi et al. ..................... 438/590
2009/0008652 A1 1/2009 Ueda et al.
(Continued)

FOREIGN PATENT DOCUMENTS

JP 2007-1855 A 1/2007

OTHER PUBLICATIONS

European Search Report dated May 9, 2014 with Application No. 13195283.0.
(Continued)

*Primary Examiner* — Minh-Loan Tran
*Assistant Examiner* — Farid Khan
(74) *Attorney, Agent, or Firm* — Ked & Associates, LLP

(57) ABSTRACT

Provided is a hetero-substrate that may include a base substrate, a buffer layer disposed on the base substrate, and a first semiconductor layer disposed on the buffer layer, the first semiconductor layer including a nitride semiconductor. A defect blocking layer is disposed on the first semiconductor layer. The defect blocking layer may include a plurality of metal droplets. A second semiconductor layer may be disposed on the defect blocking layer, the second semiconductor layer including a nitride semiconductor.

9 Claims, 6 Drawing Sheets

(51) Int. Cl.
*H01L 29/205* (2006.01)
*H01L 33/02* (2010.01)

(56) References Cited

U.S. PATENT DOCUMENTS

2010/0117115 A1* 5/2010 Tanaka et al. ............... 257/103
2010/0320506 A1* 12/2010 Varangis et al. ............. 257/201
2011/0186863 A1* 8/2011 Lee et al. ..................... 257/79
2012/0205616 A1* 8/2012 Zhang et al. ................. 257/13
2014/0103380 A1* 4/2014 Lee .............................. 257/98

OTHER PUBLICATIONS

European Office Action issued in Application No. 13195283.0 dated Jul. 13, 2015.

* cited by examiner

SUBSTRATE HAVING HETERO-STRUCTURE, METHOD FOR MANUFACTURING THE SAME AND NITRIDE SEMICONDUCTOR LIGHT EMITTING DEVICE USING THE SAME

CROSS-REFERENCE TO RELATED APPLICATION(S)

This application claims priority under 35 U.S.C. §119 to Korean Patent Application No. 10-2013-0051781, filed on May 8, 2013, whose entire disclosure is hereby incorporated by reference.

BACKGROUND

1. Field

The present disclosure relates to a nitride semiconductor, and more specifically, to a substrate having a hetero-structure (hereinafter, referred to simply as a "hetero-substrate"), a method for manufacturing the same, and a nitride semiconductor light emitting device using the same.

2. Background

A light emitting device represented by a light emitting diode (LED) provides various colors through a p-n junction diode which converts electrical energy into light energy by controlling a compositional ratio of a compound semiconductor produced using a compound of Group III and V elements on the periodic table.

Nitride semiconductors have attracted much attention in the field of development of optical devices and high-power electronic elements due to high thermal stability and wide band-gap energy thereof. In particular, blue light emitting devices, green light emitting devices, UV light emitting devices and the like using nitride semiconductors are commercialized and have entered widespread use.

The light emitting device using such a nitride semiconductor may be implemented on a hetero-substrate made of materials such as sapphire or silicon carbide (SiC). As such, when nitride semiconductor thin films having a hetero-junction are grown using a sapphire substrate or other hetero-substrates or the like, differences in lattice mismatch and coefficient of thermal expansion caused by the hetero-junction may cause high crystal defects and high strain in thin films.

Regarding the nitride semiconductor thin films grown on a sapphire substrate, development of low-temperature gallium nitride (GaN) and low-temperature aluminum nitride (AlN) buffers and the like have been investigated in order to reduce dislocation generated on the substrate, such that defect density is reduced to some extent. However, the nitride semiconductor thin films still have a high defect density of about $10^8$ cm$^{-2}$.

In addition, when a hetero-junction is formed on a silicon (Si) substrate, dislocation density may still be high in spite of applying various thin film growth methods. In particular, in the process of cooling gallium nitride semiconductors grown at a high temperature to room temperature, there are problems associated with tensile strain applied to the thin film due to differences in coefficient of thermal expansion between the thin film and the Si substrate.

Meanwhile, although growth of nitride semiconductor thin films using a GaN substrate may be the most superior growth method developed to date, production methods of GaN substrates have technical problems hindering commercialization, and entail a cost several tens to several hundreds times the cost of hetero-substrates, such as sapphire or Si, in terms of economical efficiency, thus restricting widespread use of GaN as a substrate.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DETAILED DESCRIPTION

Reference will now be made in detail to the preferred embodiments of the present disclosure, examples of which are illustrated in the accompanying drawings. Wherever possible, the same reference numbers will be used throughout the drawings to refer to the same or like parts.

However, the present disclosure allows various modifications and variations and specific embodiments thereof are exemplified through drawings and will be described in detail. The present disclosure should not be construed as limited to the embodiments set forth herein and includes modifications, variations, equivalents, and substitutions compliant with the spirit and scope of the present disclosure defined by the appended claims.

It will be understood that when an element such as a layer, area, or substrate is referred to as being "on" another element, it can be directly on the element, or one or more intervening elements may also be present.

In addition, it will be understood that although terms such as "first" and "second" may be used herein to describe elements, components, areas, layers and/or regions, the elements, components, areas, layers and/or regions should not be limited by these terms.

Figure 1:
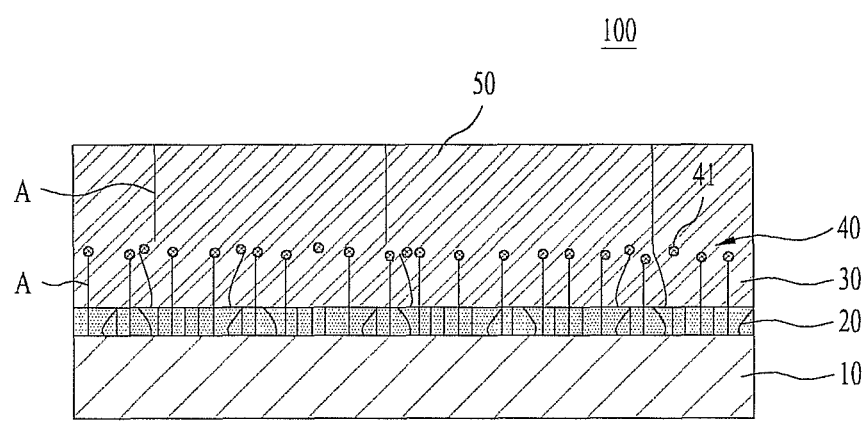
FIG. 1 shows an example of a hetero-substrate.

FIG. 1 shows an example of a hetero-substrate 100 used for manufacture of a nitride semiconductor device. A hetero-substrate or hetero-structure as used herein may refer to a semiconductor having multiple layers. The hetero-substrate 100 may include a base substrate 10. The base substrate 10 may be a sapphire or silicon (Si) substrate, but is not limited thereto. A buffer layer 20 may be disposed on the base substrate 10. The buffer layer 20 may include a nucleation layer that enables formation of a nitride semiconductor by hetero-junction on a substrate. The substrate may be a substrate other than a nitride semiconductor substrate, such as a sapphire or silicon (Si) substrate. The buffer layer 20 may also serve as the nucleation layer.

A first semiconductor layer 30 that includes a nitride semiconductor may be disposed on the buffer layer 20. The nitride semiconductor may be a semiconductor containing nitride such as gallium nitride (GaN), aluminum nitride (AlN), aluminum gallium nitride (AlGaN), indium gallium nitride (InGaN), or another appropriate type of material.

A defect blocking layer 40 that includes a plurality of metal droplets 41 may be disposed on the first semiconductor layer 30. The metal droplets 41 may be made of a single metal material or a mixture of two or more metal materials. For example, a second metal 42 of a second type may be disposed on a first metal 43 of a first type (see, for example, FIG. 6). For example, the first metal 43 may be coated with the second metal 42. The first metal 43 may include at least one of Ga, In or Al, and the second metal 42 may include at least one of Au, Ag, Cu, Pt, Ni, Cr or Pd. It should be appreciated that use of other appropriate types of materials is also possible.

Meanwhile, a density of the metal droplets 41 may be $1 \times 10^{18}$ $cm^{-2}$ or more, with respect to the overall area of the defect blocking layer 40. Such a metal droplet 41 may function to block crystal defects, such as dislocation, of the semiconductor.

When a nitride semiconductor is formed on a heterogeneous base substrate 10, threading dislocation A may occur to cause defects or irregularities in the semiconductor. The dislocation may extend from the buffer layer 20 that includes the nucleation layer into the first semiconductor layer 30.

As illustrated in FIG. 1, the threading dislocation A may be blocked by the defect blocking layer 40 that includes the metal droplets 41, and a high-quality nitride semiconductor with a greatly reduced dislocation density may thus be formed on the defect blocking layer 40.

In addition, the defect blocking layer 40 may be formed on the heterogeneous base substrate 10, thus functioning to reduce internal strain. For example, internal strain may remain due to differences in crystal lattice constant between the materials such as sapphire or silicon and the nitride semiconductor. This internal strain may be reduced by the defect blocking layer 40. The defect blocking layer 40 may include one or more types of metal droplets 41.

A second semiconductor layer 50 may be disposed on the defect blocking layer 40. The defect blocking layer 40 may allow the second semiconductor layer 50 to be a high-quality nitride semiconductor having a reduced dislocation density and internal strain. Because dislocation and defect density of the hetero-substrate 100 having this structure are reduced by the defect blocking layer 40 that includes the plurality of metal droplets 41, a low-dislocation, low-defect, high-quality nitride semiconductor thin film may be grown on the hetero-substrate 100.

In addition, tensile strain of the nitride semiconductor thin film grown on the hetero-substrate 100 may be reduced and cracks, which may be generated upon growth of thin films having a high thickness, can thus be prevented. Furthermore, substrate bending or the like may be prevented and uniformity of composition of thin films formed on the hetero-substrate 100, wavelength of the light emitting device, and the like, can thus be improved.

Figure 2:
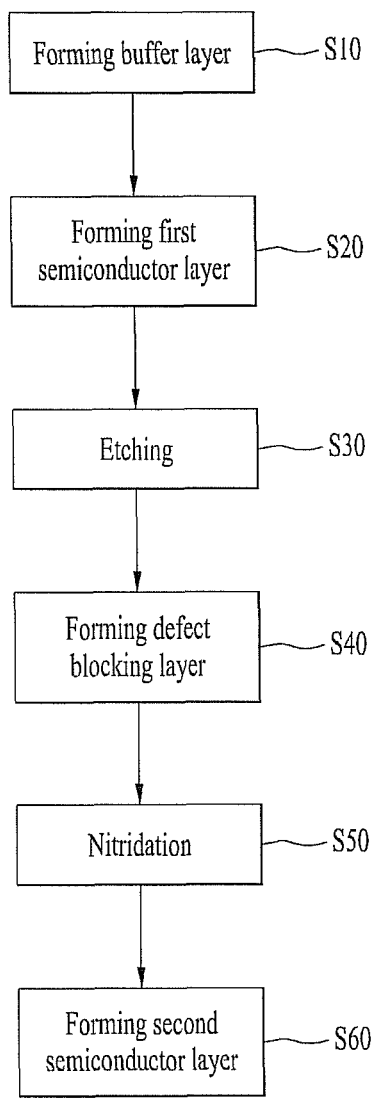
FIG. 2 is a flowchart illustrating an example of a method for manufacturing a hetero-substrate.

FIG. 2 is a flowchart of a method for manufacturing a hetero-substrate. Hereinafter, the method for manufacturing the hetero-substrate will be described with reference to FIG. 2 and other drawings.

Figure 3:
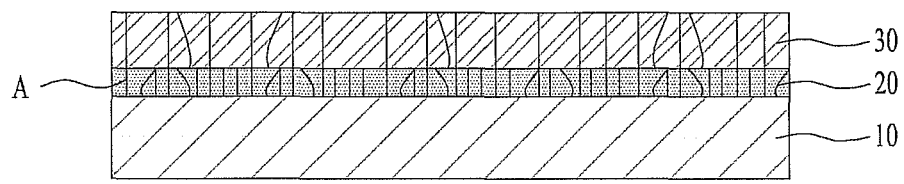
FIG. 3 is a sectional view illustrating a state in which a buffer layer and a first semiconductor layer are formed.

First, as shown in FIG. 3, a buffer layer 20 may be formed on a base substrate 10, in step S10, and a first semiconductor layer 30 may be formed on the buffer layer 20, in step S20. As illustrated, a plurality of dislocations A may be formed on the buffer layer 20. Some of the dislocations may be removed due to direction conversion or the like. Accordingly, a dislocation density of the first semiconductor layer 30 may be lower than that of the buffer layer 20.

Figure 4:
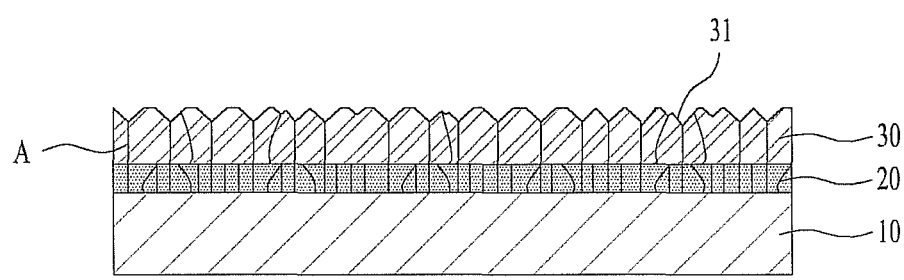
FIG. 4 is a sectional view illustrating a state in which a surface of the first semiconductor layer is etched.

Then, as shown in FIG. 4, a surface of the first semiconductor layer 30 may be etched, in step S30, to form a plurality of pits 31 having inclined surfaces. The formation of the pits 31 may be carried out by high-temperature dry etching.

During formation of the first semiconductor layer 30 that includes a nitride semiconductor, injection of source material may be stopped and high-temperature dry etching may be performed under a hydrogen ($H_2$) atmosphere at an elevated temperature of 1,200° C. at a position (e.g., height) in which the defect blocking layer 40 is to be formed.

A start point of the high-temperature dry etching of the nitride semiconductor thin film may predominantly be at a dislocation position. Accordingly, as shown in FIG. 4, a surface, which is etched around dislocations, may be obtained. For example, the pits 31 having inclined surfaces around dislocations may be formed. The pits 31 may be referred to herein as dislocation etch pits.

Figure 5:
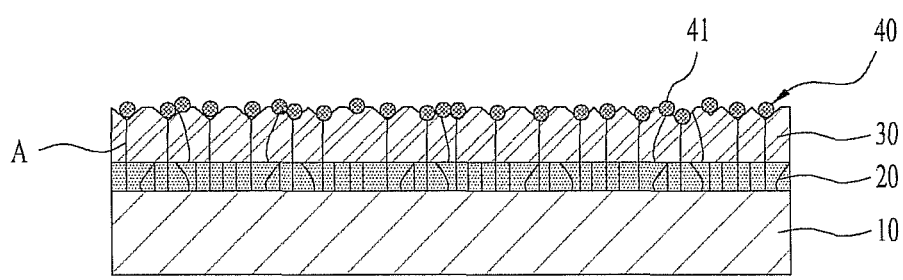
FIG. 5 is a sectional view illustrating a state in which a defect blocking layer is formed.

As shown in FIG. 5, a defect blocking layer 40 that includes the plurality of metal droplets 41 may be formed on a first semiconductor layer 30 including the pits 31, in step S40. Formation of the metal droplets 41 may be carried out using at least one of gallium (Ga), indium (In) or aluminum (Al) after decreasing a temperature of a growth apparatus for forming the semiconductor to about 500° C. or less.

The formation of the metal droplet 41 may be carried out using an organometallic source including at least one of Ga, In or Al. For example, the formation may be carried out by supplying the organometallic source together with a carrier gas. At this time, supply of a nitrogen source ($NH_3$) injected upon formation of the nitride semiconductor may be stopped.

Figure 6:
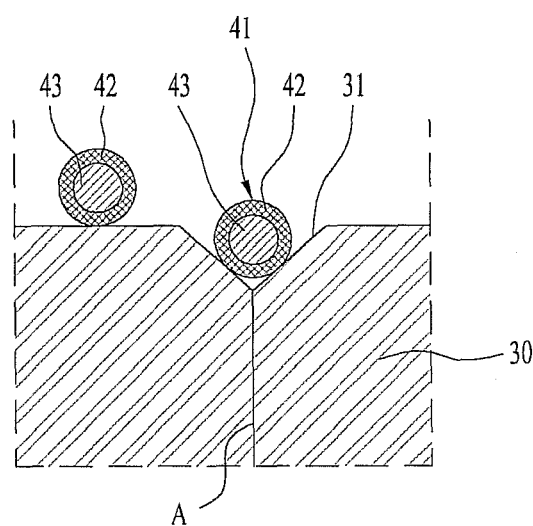
FIG. 6 is a schematic view illustrating an example in which metal droplets are formed.
Figure 7:
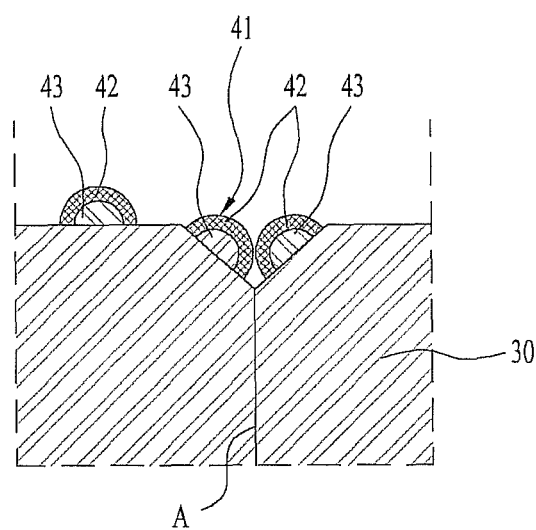
FIG. 7 is a schematic view illustrating another example in which metal droplets are formed.

Meanwhile, as shown in FIGS. 6 and 7, a first metal 43 such as Ga, In or Al may be formed, and a second metal 42 such as gold (Au), silver (Ag), copper (Cu), platinum (Pt), nickel (Ni), chromium (Cr) or palladium (Pd) may then be formed on the first metal 43. The formation of the second metal 42 may be carried out using an organometallic source that includes at least one of Au, Ag, Cu, Pt, Ni, Cr or Pd, similar to formation of the first metal 43. For example, the formation of the second metal 42 may be carried out by supplying the organometallic source together with a carrier gas. In addition, a temperature at which the second metal 42 is formed may be lower than that of the first metal particle 43.

The metal droplets 41, thus formed, may have a shape shown in FIG. 6 or 7. For example, as shown in FIG. 6, the first metal 43 may be coated with the second metal 42 to constitute a particle (droplet) and the particle may be disposed on an upper side of the first semiconductor layer 30 or the inclined surfaces of the pits 31. In addition, as shown in FIG. 7, the first metal 43 may adhere to at least one side of the first semiconductor layer 30 or the pits 31, and the first metal 43 may be coated with the second metal 42. In this case, only the exposed portion of the first metal 43 may be coated. A density of the metal droplets 41 may be $1 \times 10^{18}$ $cm^{-2}$ or more, with respect to an area of the first semiconductor layer 30 or the defect blocking layer 40.

One of the reason for forming the first metal 43 and the second metal 42 as described above is that the first metal 43 may readily transform into a nitride semiconductor during a subsequent nitridation process, and may not maintain its metal shape. As such, when the first metal 43 does not maintain its shape, offset effect of dislocations in a surface dislocation point of the first semiconductor layer 30 exposed by etching may be reduced.

Accordingly, metal droplets of the first metal 43 may be protected by covering the first metal 43 of the first type with the second metal 42 of the second type. An increase in dislocations upon subsequent nitridation and nitride semiconductor thin film formation may be prevented by forming a solid solution.

Next, the surfaces of metal droplets 41 on the first semiconductor layer 30 may be subjected to nitridation by injecting a nitrogen source (NH$_3$) into a growth apparatus, in step S50. Next, a second semiconductor layer 50 that includes a nitride semiconductor may be formed on the nitridated defect blocking layer 40, in step S60.

After growth of the metal droplets 41, a temperature of the growth apparatus may be elevated to 500 to 600° C. and a nitride semiconductor thin film protective layer may be grown at a temperature lower than a nitride semiconductor growth temperature to a thickness of about several tens to about several hundred nanometers. In this process, the surface may not completely be two-dimensionally flat, but may still function to prevent movement of the metal constituting the metal droplets 41 upward using a relatively low temperature and to offset dislocation at the dislocation point.

Figure 8:
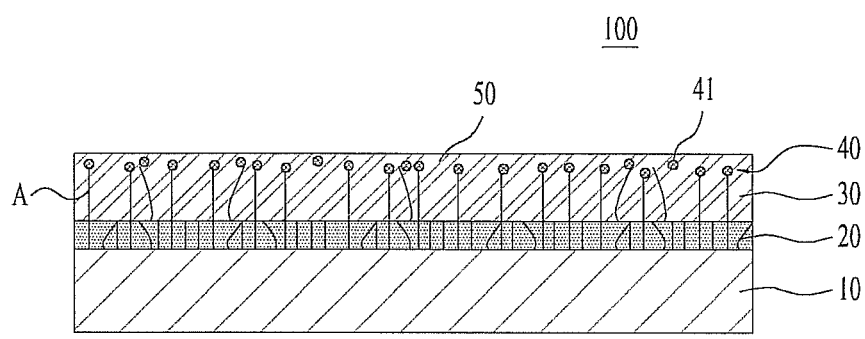
FIG. 8 is a sectional view illustrating a state in which a second semiconductor layer is formed.

Next, a semiconductor thin film including a nitride semiconductor may be grown at a high temperature to obtain a flat surface, as illustrated in FIG. 8. For example, the growth of the second semiconductor layer 50 may include primarily forming a protective layer at a relatively low temperature and secondarily forming a nitride semiconductor layer having a flat surface at a high temperature. When the second semiconductor layer 50 is formed as described above, a structure of the hetero-substrate 100 as shown in FIG. 1 may be obtained.

The growth of the hetero-substrate 100 may be carried out by a method such as MOCVD or HVPE. The defect blocking layer 40 that includes the metal droplets 41 may be formed in-situ in the nitride semiconductor growth apparatus. For example, because the formation of the defect blocking layer 40 may be carried out in a nitride semiconductor (such as gallium nitride, GaN) thin film growth apparatus, a thin film hetero-substrate 100 may be grown in a single stage without outflow of samples.

Accordingly, formation of the hetero-substrate 100 may be effective in improving production efficiency of devices using a nitride semiconductor thin film and reducing cost thereof. Various semiconductor devices using a nitride semiconductor may be manufactured, based on the hetero-substrate 100. Such a semiconductor device may include a light emitting device such as a nitride light emitting diode or a laser diode, a transistor device such as an IGBT or HEMT, and the like.

Figure 9:
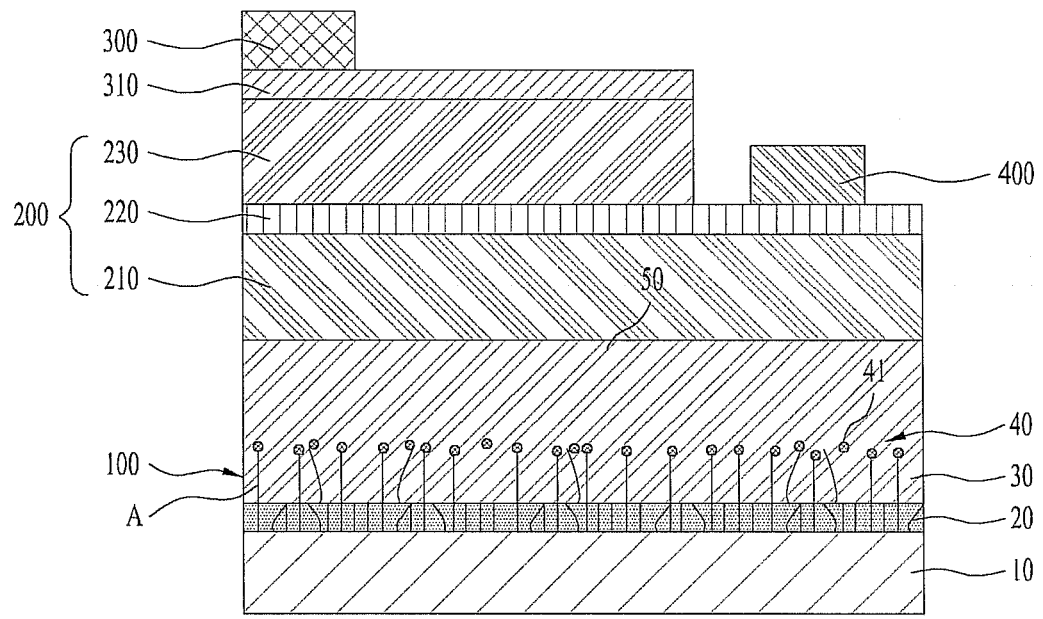
FIG. 9 is a sectional view illustrating an example of a light emitting device manufactured using the hetero-substrate.

Hereinafter, a process of manufacturing a light emitting device such as a light emitting diode on the hetero-substrate 100 will be briefly described. First, as shown in FIG. 9, a semiconductor structure 200 that includes an n-type semiconductor layer 210, an active layer 220 and a p-type semiconductor layer 230 may be formed on the hetero-substrate 100. Next, a transparent conductive layer 310 may be formed on the semiconductor structure 200 and a p-type electrode 300 may be formed on the transparent conductive layer 310. After etching to expose the n-type semiconductor layer 210, an n-type electrode 400 may be formed on the n-type semiconductor layer 210 to manufacture a lateral light emitting diode as shown in FIG. 9.

Figure 10:
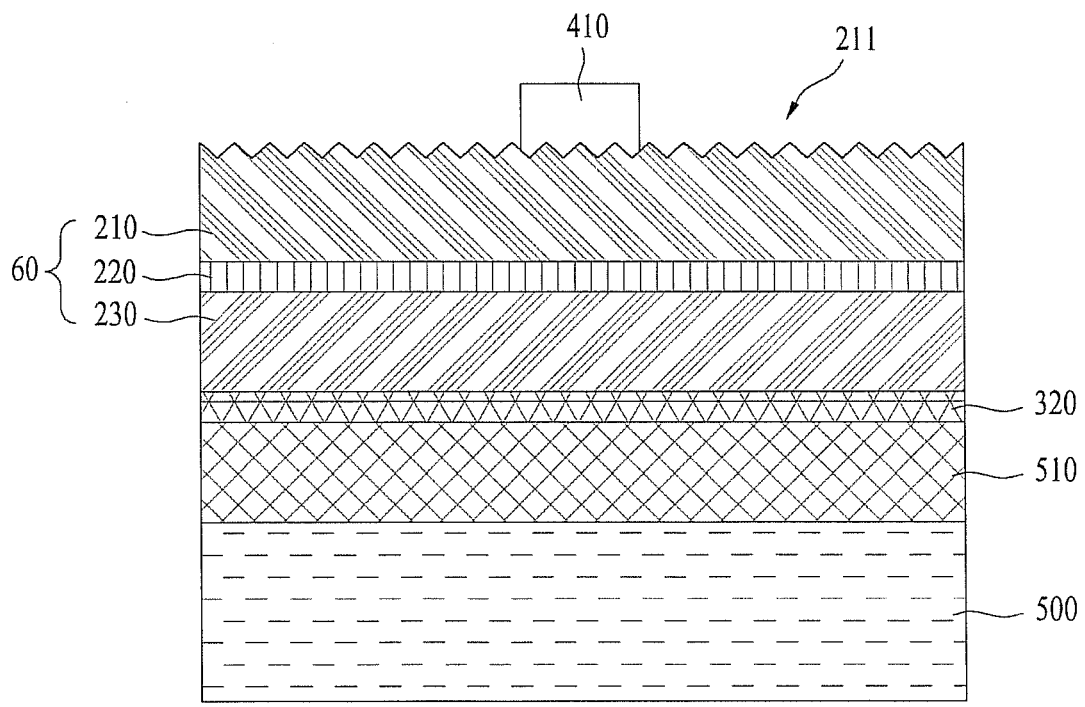
FIG. 10 is a sectional view illustrating an example of a light emitting device manufactured using the hetero-substrate.

Meanwhile, as shown in FIG. 10, manufacture of a vertical light emitting diode may be possible. In the vertical light emitting diode, the hetero-substrate 100 used as the growth substrate may be removed.

Referring to FIG. 1, in the vertical light emitting diode, the semiconductor structure 200 that includes the n-type semiconductor layer 210, the active layer 220 and the p-type semiconductor layer 230 may be grown on the hetero-substrate 100. In addition, a p-type electrode 320 may be formed on the p-type semiconductor layer 230 and a support layer 500 may be adhered to the p-type electrode 320 using a solder layer 510. The support layer 500 may include a metal or a semiconductor.

Next, the hetero-substrate 100 may be removed from the resulting structure supported by the support layer 500 to expose the n-type semiconductor layer 210. When an n-type electrode 410 is formed on the exposed surface, a vertical light emitting diode structure as shown in FIG. 10 may be obtained.

A light extraction structure 211 may be formed on an upper surface of the n-type semiconductor layer 210. During removal of the hetero-substrate 100, the pits 31 that include the inclined surface described above may be exposed. When etching is performed upon the pit 31, the shape of the pit 31 may be transferred to the n-type semiconductor layer 210 by etching, and a light extraction structure 211 that includes the transferred shape may be obtained. Accordingly, the pits 31 may serve as a light extraction structure, thus advantageously improving light output of the light emitting device.

The present disclosure is directed to a substrate having a hetero-structure, a method for manufacturing the same, and a nitride semiconductor light emitting device using the same.

It is one object of the present disclosure to provide a hetero-substrate which minimizes crystal defects that may be generated during hetero-thin film growth, a method for manufacturing the same, and a nitride semiconductor light emitting device using the same.

Additional advantages, objects, and features of the disclosure as set forth in part in the foregoing description and in part apparent to those having ordinary skill in the art upon examination of the disclosure or may be learned from practice of the disclosure. The objectives and other advantages of the disclosure may be realized and attained by the structure particularly pointed out in the written description and claims hereof as well as the appended drawings.

To achieve these objects and other advantages and in accordance with the purpose of the disclosure, as embodied and broadly described herein, a hetero-substrate may include a base substrate, a buffer layer disposed on the base substrate, a first semiconductor layer disposed on the buffer layer, the first semiconductor layer including a nitride semiconductor, a defect blocking layer disposed on the first semiconductor layer, the defect blocking layer including a plurality of metal droplets, and a second semiconductor layer disposed on the defect blocking layer, the second semiconductor layer including a nitride semiconductor.

In accordance with another aspect of the present disclosure, a nitride semiconductor light emitting device may include a base substrate, a buffer layer disposed on the base substrate, a first semiconductor layer disposed on the buffer layer, the first semiconductor layer including a nitride semiconductor, a defect blocking layer disposed on the first semiconductor layer, the defect blocking layer including a plurality of metal droplets, a second semiconductor layer disposed on the defect blocking layer, the second semiconductor layer including a nitride semiconductor, a first conductive semiconductor layer disposed on the second semiconductor layer, an active layer, a second conductive semiconductor layer, a first electrode electrically connected to the first conductive semiconductor layer and a second electrode electrically connected to the second conductive semiconductor layer.

In accordance with another aspect of the present disclosure, a method for manufacturing a hetero-substrate may include forming a buffer layer on a base substrate, forming a first semiconductor layer including a nitride semiconductor on the buffer layer, etching a surface of the first semiconductor layer, forming a defect blocking layer including a plurality of metal droplets on the etched surface of the first semiconductor layer, subjecting a surface of the first semiconductor layer provided with the defect blocking layer to nitridation, and forming a second semiconductor layer including a nitride semiconductor on the defect blocking layer.

In one embodiment, a hetero-substrate may include a base substrate, a buffer layer disposed on the base substrate, a first semiconductor layer disposed on the buffer layer, which first semiconductor layer includes a nitride semiconductor, a defect blocking layer disposed on the first semiconductor layer, which defect blocking layer includes a plurality of metal droplets, and a second semiconductor layer disposed on the defect blocking layer, which second semiconductor layer includes a nitride semiconductor. The hetero-substrate may further include The first semiconductor layer may further include a plurality of pits having an inclined surface formed on an upper surface of the first semiconductor layer, and at least one of the plurality of metal droplets may be provided on the inclined surface of the pits.

The hetero-substrate may also include the pits provided to correspond to a position of a threading dislocation in the first semiconductor layer. Further, a dislocation density of the second semiconductor layer may be lower than that of the first semiconductor layer.

The metal droplets may include a first metal and a second metal provided on the first metal. The first metal may include at least one of Ga, In or Al. The second metal may include at least one of Au, Ag, Cu, Pt, Ni, Cr or Pd and may be provided to coat an outer surface of the first metal. A density of the metal droplets may be greater than or equal to $1 \times 10^{18}$ $cm^{-2}$, with respect to an area of the defect blocking layer.

In another embodiment, a nitride semiconductor light emitting device may include a base substrate, a buffer layer disposed on the base substrate, a first semiconductor layer disposed on the buffer layer, which first semiconductor layer may include a nitride semiconductor, a defect blocking layer disposed on the first semiconductor layer, which defect blocking layer may include a plurality of metal droplets, a second semiconductor layer disposed on the defect blocking layer, which second semiconductor layer may include a nitride semiconductor, a first conductive semiconductor layer disposed on the second semiconductor layer, an active layer, a second conductive semiconductor layer, a first electrode coupled to the first conductive semiconductor layer, and a second electrode coupled to the second conductive semiconductor layer.

The first semiconductor layer may include a plurality of dislocation etch pits on a surface of the first semiconductor layer that faces the second semiconductor layer, at least one of the plurality of metal droplets being provided on the dislocation etch pits. The dislocation etch pits may include inclined surfaces that extract light from the light emitting device.

In one embodiment, a method for manufacturing a hetero-substrate may include forming a buffer layer over a base substrate, forming a first semiconductor layer that includes a nitride semiconductor over the buffer layer, etching a surface of the first semiconductor layer to form a plurality of dislocation etch pits, forming a defect blocking layer that includes a plurality of metal droplets over the etched surface of the first semiconductor layer, subjecting a surface of the first semiconductor layer provided with the defect blocking layer to nitridation and forming a second semiconductor layer that includes a nitride semiconductor over the defect blocking layer.

The formation of the defect blocking layer may include forming a first metal of a first type on a surface of the first semiconductor layer and forming a second metal of a second type on the first metal, where the first and second metal types are different. The first metal may be coated with the second metal. A formation temperature of the second metal may be lower than that of the first metal. Further, the first metal of the first type may include at least one of Ga, In or Al and the second metal of the second type may include at least one of Au, Ag, Cu, Pt, Ni, Cr or Pd. The formation of the defect blocking layer over the first semiconductor layer may be carried out in-situ using an organometallic source.

The metal droplets may be provided over the plurality of pits having an inclined surface formed by etching the surface of the first semiconductor layer. A density of the metal droplets may be greater than or equal to $1 \times 10^{18}$ $cm^{-2}$, with respect to an area of the defect blocking layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A hetero-substrate comprising:
   a base substrate;
   a buffer layer disposed on the base substrate;
   a first semiconductor layer disposed on the buffer layer, the first semiconductor layer including a nitride semiconductor;
   a defect blocking layer disposed on the first semiconductor layer, the defect blocking layer including a plurality of metal droplets, wherein the metal droplet comprises a first metal and a second metal disposed on the first metal, and wherein the first metal is covered with the second metal; and
   a second semiconductor layer disposed on the defect blocking layer, the second semiconductor layer including a nitride semiconductor.

2. The hetero-substrate according to claim 1, wherein the first semiconductor layer includes a plurality of pits having an inclined surface formed on an upper surface of the first semiconductor layer, and at least one of the plurality of metal droplets being provided on the inclined surface of the pits.

3. The hetero-substrate according to claim 2, wherein the pits are provided to correspond to a position of a threading dislocation in the first semiconductor layer.

4. The hetero-substrate according to claim 1, wherein a dislocation density of the second semiconductor layer is lower than that of the first semiconductor layer.

5. The hetero-substrate according to claim 1, wherein the first metal includes at least one of Ga, In or Al.

6. The hetero-substrate according to claim 1, wherein the second metal includes at least one of Au, Ag, Cu, Pt, Ni, Cr or Pd.

7. The hetero-substrate according to claim 1, wherein a density of the metal droplets is greater than or equal to $1 \times 10^{18}$ $cm^{-2}$, with respect to an area of the defect blocking layer.

8. A nitride semiconductor light emitting device comprising:
a base substrate;
a buffer layer disposed on the base substrate;
a first semiconductor layer disposed on the buffer layer, the first semiconductor layer including a nitride semiconductor;
a defect blocking layer disposed on the first semiconductor layer, the defect blocking layer including a plurality of metal droplets, wherein the metal droplet comprises a first metal and a second metal disposed on the first metal, and wherein the first metal is covered with the second metal;
a second semiconductor layer disposed on the defect blocking layer, the second semiconductor layer including a nitride semiconductor;
a first conductive semiconductor layer disposed on the second semiconductor layer;
an active layer;
a second conductive semiconductor layer;
a first electrode coupled to the first conductive semiconductor layer; and
a second electrode coupled to the second conductive semiconductor layer.

9. The nitride semiconductor light emitting device according to claim 8, wherein the first semiconductor layer includes a plurality of dislocation etch pits on a surface of the first semiconductor layer that faces the second semiconductor layer, at least one of the plurality of metal droplets being provided on the dislocation etch pits, and wherein the dislocation etch pits include inclined surfaces that extract light from the light emitting device.

* * * * *